US 8,729,971 B2

United States Patent
Kubota

(10) Patent No.: US 8,729,971 B2
(45) Date of Patent: May 20, 2014

(54) OSCILLATOR, AND CLOCK GENERATOR, SEMICONDUCTOR DEVICE, AND ELECTRONIC DEVICE INCLUDING THE SAME

(75) Inventor: Shinichi Kubota, Minoo (JP)

(73) Assignee: Ricoh Company, Ltd., Tokyo (JP)

( * ) Notice: Subject to any disclaimer, the term of this patent is extended or adjusted under 35 U.S.C. 154(b) by 87 days.

(21) Appl. No.: 13/328,046

(22) Filed: Dec. 16, 2011

(65) Prior Publication Data
US 2012/0154066 A1  Jun. 21, 2012

(30) Foreign Application Priority Data

Dec. 20, 2010 (JP) .................. 2010-282927

(51) Int. Cl.
*H03B 5/36* (2006.01)
(52) U.S. Cl.
CPC ........ *H03B 5/364* (2013.01); *H03B 2200/0012* (2013.01); *H03B 2200/0062* (2013.01); *H03B 2200/0082* (2013.01)
USPC .................. 331/116 FE; 331/158; 331/109; 331/183
(58) Field of Classification Search
USPC ........ 331/116 R, 116 FE, 158, 160, 109, 182, 331/183, 185, 186
See application file for complete search history.

(56) References Cited

U.S. PATENT DOCUMENTS

| 6,798,301 | B1 * | 9/2004 | Balan et al. | 331/74 |
|---|---|---|---|---|
| 6,819,196 | B2 * | 11/2004 | Lovelace et al. | 331/183 |
| 7,042,299 | B2 * | 5/2006 | Tachibana et al. | 331/158 |
| 7,123,113 | B1 * | 10/2006 | Brennan et al. | 331/158 |
| 8,035,455 | B1 * | 10/2011 | McMenamy | 331/109 |
| 8,102,217 | B2 * | 1/2012 | Aoki | 331/160 |
| 8,143,963 | B2 * | 3/2012 | Lin et al. | 331/186 |
| 2005/0073371 | A1 * | 4/2005 | Brett et al. | 331/74 |

FOREIGN PATENT DOCUMENTS

| JP | 2-94803 | 4/1990 |
|---|---|---|
| JP | 7-154138 | 6/1995 |
| JP | 10-112621 | 4/1998 |
| JP | 3136600 | 12/2000 |
| JP | 2006-121477 | 5/2006 |
| JP | 2007-174447 | 7/2007 |

* cited by examiner

*Primary Examiner* — Ryan Johnson
(74) *Attorney, Agent, or Firm* — Cooper & Dunham LLP

(57) ABSTRACT

An oscillator includes a reference voltage generator, an oscillation element configured to oscillate by either a drive voltage or a drive current and output an oscillation signal, a peak hold element configured to detect a peak level of the oscillation signal for output; and a controller configured to increase or decrease the drive voltage or drive current in accordance with the reference voltage generated by the reference voltage generator and the peak level output from the peak hold element.

5 Claims, 6 Drawing Sheets

OSCILLATOR, AND CLOCK GENERATOR, SEMICONDUCTOR DEVICE, AND ELECTRONIC DEVICE INCLUDING THE SAME

CROSS REFERENCE TO RELATED APPLICATION

The present application is based on and claims priority from Japanese Patent Application No. 2010-282927, filed on Dec. 20, 2010, the disclosure of which is hereby incorporated by reference in its entirety.

BACKGROUND OF THE INVENTION

1. Field of the Invention

The present invention relates to an oscillator with an oscillation circuit such as a crystal oscillation element which can reduce the power consumption of the oscillation circuit and reduce the occurrence of noise to prevent deterioration in oscillation property. It also relates to a clock generator, a semiconductor device and an electronic device incorporating such an oscillator. The electronic device is, for example, a wrist watch, a mobile phone, a personal digital assistance (PDA), or a computer terminal.

2. Description of the Prior Art

Such an electronic device often includes a crystal oscillator. For example, Japanese Patent Application Publication No. 2006-121477 (Reference 1) discloses, as shown in FIG. 8A, a crystal oscillator which includes an inverter circuit 84 which receives the output amplitude of a crystal oscillation circuit 81 to change in output pulse width in accordance with a change in the output amplitude. Thereby, it can detect the amplitude of an oscillation signal of the oscillation circuit 81 by monitoring the pulse width or duty ratio of a pulse signal from the inverter circuit 84, and control the drive voltage VOSC of the oscillation circuit 81 on the basis of a detected result so that the output amplitude thereof is almost turned to a saturation level. It aims to automatically secure, with a simple configuration, an optimal oscillation allowance in line with a difference in products, ambient environment or the level of oscillation at power-on while reducing power consumption during stationary oscillation.

Specifically, the oscillator includes an amplitude detector 82 having the inverter circuit 84, a level converter circuit 85, and a lowpass filter 86, a transformer circuit 83 having a differential amplifier 87 and a PMOS transistor 88, and a stabilizing capacitance 89. The level converter circuit 85 converts the pulse amplitude of the inverter circuit 84 and the low pass filter 86 acquires an integrated value thereof. The integrated value and a reference voltage VREF slightly lower than the output level in amplitude saturation are input to the differential amplifier 87. If the output (integrated value) of the inverter circuit 84 is lower than the reference voltage VREF, the voltage of the gate of the PMOS transistor 88 is decreased to increase the drive voltage VOSC and output amplitude of the crystal oscillation circuit 81. If it is higher than the reference voltage VREF, the voltage of the gate of the PMOS transistor 88 is increased to decrease the drive voltage VOSC and output amplitude of the crystal oscillation circuit 81.

As shown in FIG. 8B, the crystal oscillation circuit 81 in general includes an inverter CI having an enhancement P-channel MOS transistor Qp and an enhancement N-channel MOS transistor Qn, a crystal oscillation element X, load capacitances CG, CD, and a feedback resistance RF. The oscillation circuit 8 outputs an oscillation signal SO.

According to the oscillator disclosed in Reference 1 the oscillation signal SO is output from the crystal oscillation circuit 81 to the inverter circuit 84 of the amplitude detector 82.

The inverter circuit 84 includes a PMOS transistor and an NMOS transistor connected in series between the power supply voltage VOSC and a GND voltage. The oscillation signal is input to the common gate of the two transistors and output from a connecting point of the two transistors.

In this configuration, as long as the input signal has either the power supply voltage VOSC or GND voltage, current does not flow into the inverter circuit 84. However, when it has an intermediate potential simultaneously turning on both the transistors, feedthrough current flows into the inverter circuit 84.

The oscillation signal SO of the oscillation circuit 81 is generally a sine wave and mostly in an intermediate potential between the power supply voltage VOSC and GND voltage. Receiving such a sine wave at the inverter circuit 84 as a logic circuit, feedthrough current flows into the inverter circuit 84 intermittently or inconstantly in a sine wave cycle, which may lead to extraneous power consumption.

Furthermore, the intermittent or inconstant power consumption may cause periodic noise in the power supply voltage VOSC of the oscillation circuit 81, which is likely to adversely affect the oscillation property of the oscillator, especially a deterioration in the jitter characteristics of the oscillation signal.

Further, the inverter circuit 84 outputs a pulse signal with a rectangular sine wave between the voltage VOSC of the oscillation circuit and GND voltage. The pulse signal falls and rises fast and contains high frequency components, and due to its high amplitude, it is likely to cause parasitic capacitive coupling or electromagnetic coupling in the wires of the oscillator, resulting in noise in the voltage VOSC.

Reference 1 does not describe the level converter 85 in detail but it has to convert the output signal from the inverter circuit 84 into a level signal via a logic gate element or a switch element.

Thus, to mount such a logic circuit outputting a rectangular wave pulse signal and analog circuits as the oscillation circuit 81 and transformer circuit 83 on the same semiconductor circuit board, the layout of the elements need be carefully designed to prevent noise with advanced technical know-how. Because of this, there is a problem that development period and product performance are often in a tradeoff relation.

FIG. 9 schematically shows the structure of an oscillator disclosed in Japanese Patent No. 3136600 (Reference 2).

The oscillator in FIG. 9 includes an oscillation circuit 91, a level detector 92 to detect the amplitude level of an oscillation signal SO output from the oscillation circuit 91 and output a rectangular wave pulse signal SP to a switched capacitor 90, a reference voltage generator (frequency-voltage converter) 93, and an amplifier 94 to amplify a reference voltage VREF to supply it to the oscillation circuit 91 as a power supply voltage ED.

In this oscillator, upon receiving the oscillation signal from the oscillation circuit 91, the level detector 92 generates a pulse signal SP to operate an inverter circuit 99, a discharge switch 95 and a bypass switch 96 constituting the switched capacitor 90.

As the one in Reference 1, the oscillator disclosed in Reference 2 uses the logic gate circuits and switches generating rectangular sine wave signals so that it faces the same problem with increasing consumption current due to the feedthrough current and deteriorating the oscillation property due to noise.

Further, Japanese Patent Application Publication No. 2-94803 (Reference 3) discloses an oscillation circuit by use of a peak voltage. It includes an oscillation element, an amplifier supplied with the output of the oscillation element, a peak detector to detect the output peak level of the amplifier, a capacitor charged with the output of the peak detector and discharged with a constant current source, a smoothening circuit to smooth a voltage varying with the charge/discharge of the capacitor, and a comparator to compare the output of the smoothing circuit with a reference level. The gain of the amplifier is controlled in accordance with a result of the comparison by the comparator.

The oscillation circuit in Reference 3 aims to improve distortion in oscillation output waveform and the stability of a solid oscillation element not to shift into a high-order oscillation mode. However, it cannot lower the power supply voltage by just controlling the gain of the oscillation circuit and the oscillation circuit in FIG. 4 thereof is not configured to control the power supply voltage Vcc. Therefore, Reference 3 fails to consider the optimal control over the power supply voltage Vcc and current consumption so that they are to be minimal.

No oscillation technique for solving all the problems above as extraneous power consumption due to transient feedthrough current, deterioration in oscillation property due to noise, especially, jitter characteristics has been proposed. Further, any of References 1 to 3 fail to address the reduction in extraneous power consumption owing to the feedthrough current as described above.

SUMMARY OF THE INVENTION

The present invention aims to provide an oscillator which includes a peak or bottom hold circuit not consuming transient electric power to be able to reduce extraneous power consumption and occurrence of noise and thereby prevent deterioration in oscillation property, as well as to provide a clock generator, a semiconductor device, and an electronic device incorporating such an oscillator.

According to one aspect of the present invention, an oscillator includes a reference voltage generator, an oscillation element configured to oscillate by either a drive voltage or a drive current and output an oscillation signal, a peak hold element configured to detect a peak level of the oscillation signal for output; and a controller configured to increase/decrease the drive voltage or drive current in accordance with the reference voltage generated by the reference voltage generator and the peak level output from the peak hold element.

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENT

Hereinafter, embodiments of the present invention will be described in detail with reference to the accompanying drawings. Wherever possible, the same reference numbers will be used throughout the drawings to refer to the same or like parts.

An oscillator is configured that the power supply voltage of an oscillation circuit is controlled by a regulator as a controller so that the oscillation circuit oscillates at desired amplitude or the peak or bottom value of the amplitude of the oscillation signal coincides with that of the reference voltage VREF. Because of this, the drive voltage as the output of the regulator is decreased to a minimum, and so is the minimum operation voltage of the regulator along with the decrease in the output voltage. Accordingly, the minimum operation voltage of the entire oscillator can be decreased.

First Embodiment

Figure 1:
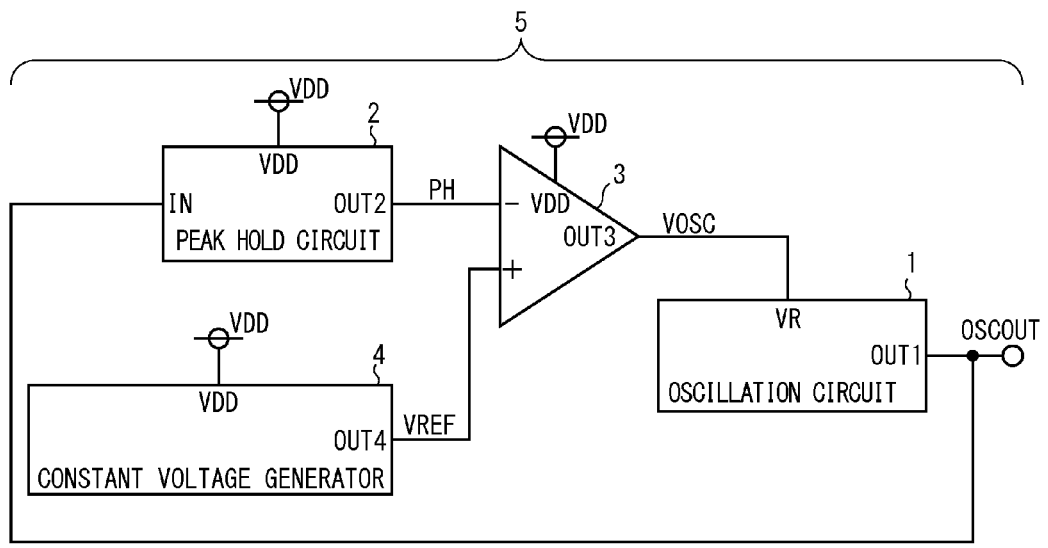
FIG. 1 schematically shows the structure of an oscillator according to a first embodiment of the present invention.

FIG. 1 shows the structure of an oscillator according to a first embodiment of the present invention by way of example.

In FIG. 1 an oscillator 5 is used in a real-time clock system having a timer or calendar function, a clock generator circuit to generate system clock signals for a microprocessor or else, or a reference clock generator circuit for a communication device. It includes an oscillation circuit 1 as an oscillation element, a peak hold circuit 2, a regulator 3 as a controller, and a constant voltage generator 4 as a reference voltage generator.

The oscillation circuit 1 uses a crystal oscillator element or the like to output an oscillation signal OSCOUT from an output terminal OUT1. The oscillation signal OSCOUT is used in a clock system or the like and input to an input terminal IN of the peak hold circuit 2.

The peak hold circuit 2 holds a voltage with a maximal value or peak of the amplitude of the oscillation signal OSCOUT for a certain period of time and outputs it as a peak hold voltage PH from an output terminal OUT2.

The constant voltage generator 4 circuit generates a constant voltage, and outputs it from an output terminal OUT4 to the regulator 3 as a reference voltage VREF.

The peak hold voltage PH and the reference voltage VREF are input to an inverting input terminal (−) and a non-inverting input terminal (+) of the regulator 3 while the voltage VOSC is output from the output terminal OUT3 of the regulator 3 to a power supply terminal VR of the oscillation circuit 1 as a drive voltage.

The regulator 3 compares the peak hold voltage PH at the inverting input terminal with the reference voltage VREF at the non-inverting input terminal to control the voltage VOSC output from the output terminal OUT3 to drop if the peak hold voltage PH is higher than the reference voltage VREF and to rise if the peak hold voltage PH is lower than the reference voltage VREF.

Meanwhile, the oscillation signal OSCOUT of the oscillation circuit 1 increases/decreases in amplitude along with an increase/decrease in the drive voltage VOSC input to the power supply terminal VR.

Thus, the regulator 3 controls the drive voltage VOSC of the oscillation circuit 1 to output the oscillation signal OSCOUT with a peak value of amplitude equal to that of the reference voltage VREF.

Figure 2:
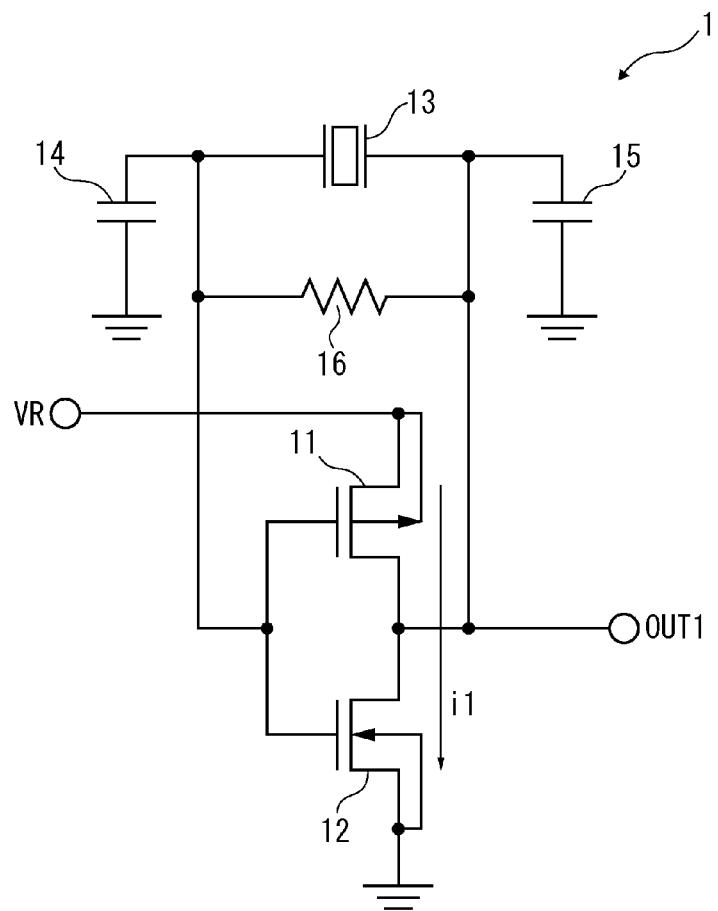
FIG. 2 shows an example of the inner structure of an oscillation circuit according to the first embodiment.

FIG. 2 shows the inner structure of the oscillation circuit 1 in FIG. 1 by way of example. It includes a PMOS transistor 11 of which a back gate and a source are connected and an NMOS transistor 12 connected at a back gate and a source with a ground potential GND (hereinafter, simply GND). The drain and gate of the transistor 11 are connected with those of the transistor 12, and the source of the PMOS transistor 11 is applied with the drive voltage VOSC from the power supply terminal VR. Thus, they constitute an inversion logic circuit as an inverter circuit.

Connecting the gate or input and the drain or output OUT1 of the inverter circuit via a resistance 16 makes the inverter circuit function as a voltage amplifier with a certain amplification rate having the gate as an input and the drain OUT1 as an output.

When the absolute values of the threshold Vth or the mutual inductances gm of the PMOS transistor 11 and NMOS transistor 12 are set to be equivalent to each other, the gate potential and output potential of the inverter circuit are zero, and they become the same potential with no load applied. Thus, the voltage thereof is about a half of the threshold voltage of the inverter circuit or the power supply terminal VR.

Further, the oscillation circuit 1 includes a crystal oscillator 13 connected between the input and output of the voltage amplifier and capacitors 14, 15 connected between the input and output terminals of the crystal oscillator 13 and GND, to oscillate at a frequency inherent to crystal.

Applied with a high voltage at the power supply terminal VR or large power for oscillation, the oscillation circuit 1 can oscillate with large amplitude in a short oscillation start period from the start of oscillation to stable oscillation.

However, applied with a high voltage at the power supply terminal VR, the gate to source voltage Vgs of the PMOS transistor 11 and the NMOS transistor 12 of the inverter circuit is increased and the ON resistance thereof is decreased, increasing feedthrough current i1 and current consumption.

This will lead to a drawback to a real-time clock system that the duration of backup function to operate only a timer by a battery or power accumulated in the capacitor may be shortened.

Oppositely, along with a gradual drop in the voltage of the power supply terminal VR, the feedthrough current i1 decreases and so does the current consumption, which elongates the duration of the backup function. However, with a decrease below a certain voltage, the power to oscillate the oscillation circuit becomes insufficient so that the oscillation amplitude of the circuit abruptly decreases, causing the oscillator to stop oscillating.

The voltage of the power supply terminal VR sufficient to sustain the minimal oscillation amplitude of the oscillator is referred to as oscillation sustainable voltage. The oscillation sustainable voltage varies due to a difference in the property of the PMOS transistor 11 and NMOS transistor 12, temperature, crystal characteristic, property parameter of the capacitors 14, 15, and parasite elements such as capacitance, resistance and inductance on an IC package or wiring of a circuit board.

However, a constant voltage of the power supply terminal VR set to be able to reliably sustain oscillation even under the worst condition will be extremely high under normal condition, causing extraneous current consumption.

In order to ideally and reliably oscillate the oscillation circuit 1 with less power consumption, it is essential to control the drive voltage input to the power supply terminal VR to be a minimum for the purpose of correcting the parameters which vary the oscillation sustainable voltage.

According to the present embodiment, it is configured that the peak hold circuit detects the amplitude of an oscillation signal and feeds it back to the regulator to control the drive voltage input to the power supply terminal VR of the oscillation circuit, to be able to constantly maintain the oscillation amplitude and reduce current consumption to a minimum.

FIG. 2 shows an example of the oscillation circuit using the crystal oscillator 13. Alternatively, a ceramic oscillator and an LC tuned oscillation circuit can be used instead of the crystal oscillator. Also, an active element can be a bipolar transistor in replace of the CMOS circuit constituted of PMOS transistors and NMOS transistors.

Figure 3:
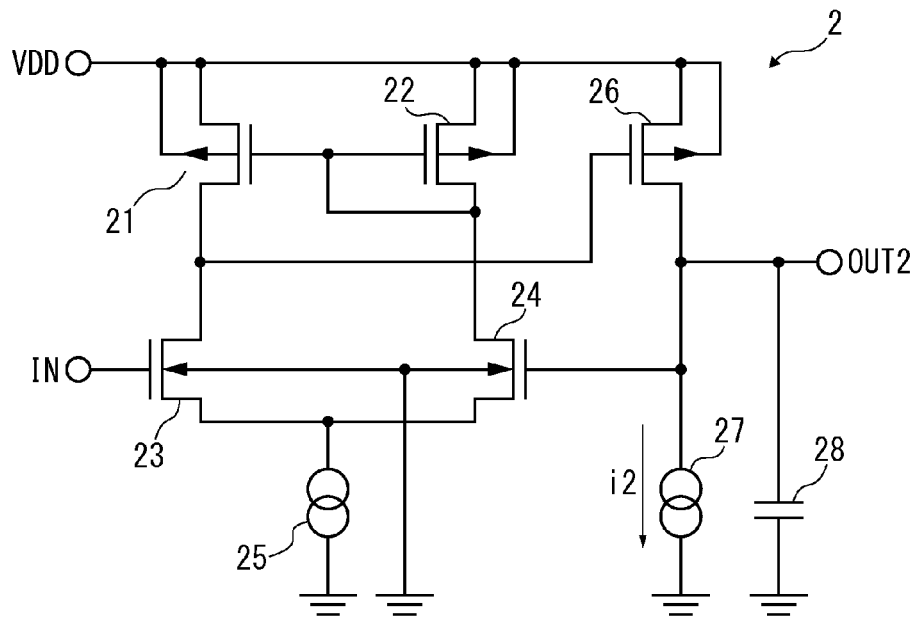
FIG. 3 shows an example of the inner structure of a peak hold circuit according to the first embodiment.

FIG. 3 shows an example of the inner structure of the peak hold circuit 2 in FIG. 1.

The peak hold circuit 2 in FIG. 3 includes a constant current source 25, a differential input stage of NMOS transistors 23, 24, a differential amplifier which includes a current mirror load of PMOS transistors 21, 22 and a source ground circuit of a PMOS transistor 26 with a constant current source 27 as a load.

The gate of the NMOS transistor 24 is connected with the output terminal OUT2. Instead, by forming the gate as an inverting input terminal and the gate IN of the NMOS transistor 23 as a non-inverting input terminal, a basic operational amplifier can be configured.

With the gate of the NMOS transistor 24 connected with the output terminal OUT2, this circuit is equivalent to a non-inverting amplifier at amplification rate of 1.0 or a voltage follower. With an appropriate element constant and operation current, a voltage follower can be realized.

The peak hold circuit 2 according to the present embodiment is realized by including a capacitor 28 connected between the output terminal OUT2 and GND and extremely reducing the current of the constant current source 27 to a value smaller than that in voltage following operation to attain an extremely slow slew rate in voltage drop at the output terminal OUT2.

The capacitance value of the capacitor 28 is set to a small value so as not to hinder the drive performance of the PMOS transistor 26 and be able to follow the rising voltage at the input terminal IN. How to set specific values of the capacitor 28 and the constant current source 27 is described in the following.

For example, with the frequency of the oscillation signal at 32.768 kHz for timepiece, the cycle of the oscillation signal will be 30.5 µs by $1/(32.768 \times 10^3) = 30.5 \times 10^3$.

Assumed that at the capacitance value 500 fF (femto Farad) of the capacitor 28, the differential amplifier and the PMOS transistors 26 in FIG. 3 are designed to sufficiently follow a rising voltage at the output terminal OUT2.

The following relation (1) is hold.

$$C \times V = i2 \times t$$

where C is a capacitance value, V is a voltage, i2 is current and t is a time. The time t is set to 30.5 µs as the cycle of 32.768 kHz.

To hold a dropping voltage V at a small value of 10 mV in the time t after the constant current source 27 flows the current i2 and discharges the capacitor 28, the current i2 is found by the following equations (2), (3):

$$500 \times 10^{-15} \times 10 \times 10^{-3} = i2 \times 30.5 \times 10^{-6}$$

$$i2 = 0.164 \times 10^{-9}$$

With the current i2 flowing into the constant current source 27 set to 0.164 nA, the peak hold circuit 2 with sine wave at 32.765 kHz can be realized.

The signal charges held in the capacitor of a sample hold circuit or a peak hold circuit is gradually leaked with time. The change rate of the hold voltage due to the leakage is generally called droop rate.

The droop rate DR (V/sec.) of the peak hold circuit 2 according to the present embodiment is expressed by the following equation (4):

$$DR = dV/dt$$

where dV is a voltage change amount (V) and dt is a temporal change (sec.)

The droop rate when the voltage changes by 10 mV in the period of 30.5 μs will be 328 (V/sec.) by $(10 \times 10^{-3})/(30.5 \times 10^{-6})$ The smaller the droop rate, the more accurately and in a longer time the peak hold circuit can hold the peak of the voltage. In the present embodiment the lower limit value of the droop rate needs to be set carefully.

For example, if the oscillation amplitude decreases due to an ambient change, to prevent the oscillation signal from stop oscillating, the voltage of the power supply terminal VR of the oscillation circuit has to be controlled to rise to increase the oscillation amplitude.

However, with a decrease in the oscillation amplitude, a small droop rate to hold the peak value too long may stop the oscillation because the control over the voltage of the power supply terminal VR to increase cannot follow the decreasing oscillation amplitude.

Therefore, to prevent the stop of oscillation, the droop rate needs to be set to be able to sustain the oscillation amplitude with the speed of an ambient change such as a temperature change causing the amplitude to decrease taken into account. The ambient change includes dew condensation, a fluctuation in the power supply voltage and the like in addition to the temperature change.

As described above, the current consumption of the peak hold circuit 2 based on the operational amplifier is constantly determined by the constant current sources 25, 27 and hardly varies due to a change in the input signal or the oscillation signal OSCOUT to the input terminal IN. Thus, it is controllable by the constant current sources 25, 27. It is able to easily realize the constant current sources 25, 27 by use of a current mirror circuit of a MOS transistor.

The voltage of the gate signal of the PMOS transistor 26 as a source ground circuit slightly varies in accordance with the input signal to the input terminal IN, but not to the extent that causes noise unlike the output signal greatly fluctuating between the power supply voltage and GND in the prior art inverter circuit.

Figure 4:
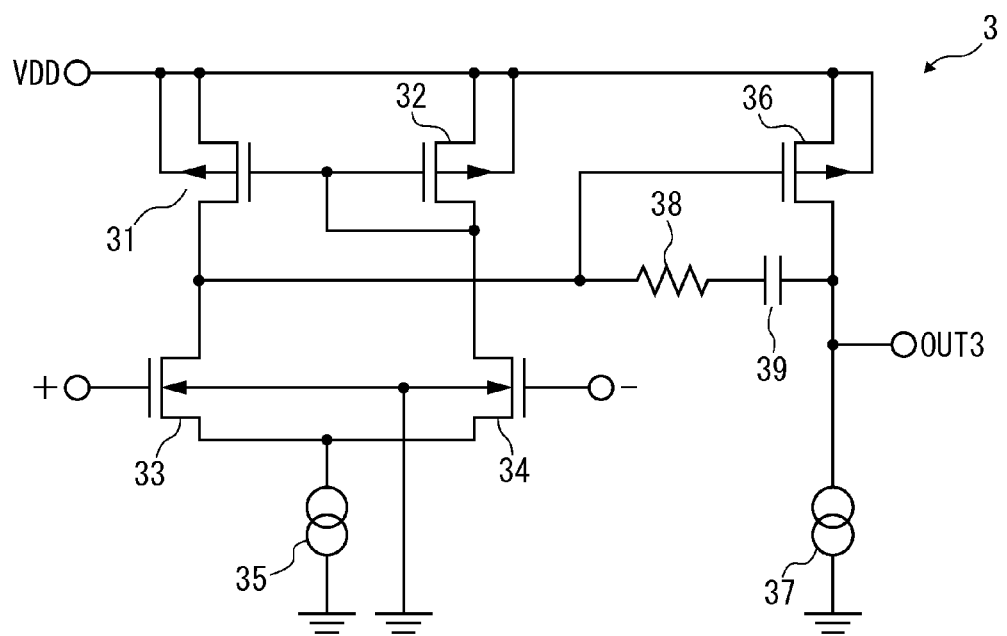
FIG. 4 shows an example of the inner structure of a regulator according to the first embodiment.

FIG. 4 shows an example of the inner structure of the regulator 3 in FIG. 1. The regulator 3 in FIG. 4 includes a constant current source 35, a differential input stage having NMOS transistors 33, 34, a differential amplifier having a current mirror load of PMOS transistors 31, 32, a source ground circuit having a PMOS transistor with a constant current source 37 as a load, a resistance 38 and a capacitor 39. The resistance 38 and capacitor 39 constitute a phase compensator with a feedback function to stably operate the regulator. Thus, the regulator 3 is a typical operational amplifier.

The oscillator 5 uses the regulator 3 to generate the drive voltage VOSC to the power supply terminal VR of the oscillation circuit 1.

The regulator 3 receives the peak hold voltage PH at the inverting input terminal (−) from the peak hold circuit 2 and a constant voltage or the reference voltage VREF at the non-inverting input terminal (+) from the constant voltage generator 4.

The regulator 3 compares the peak hold voltage PH at the inverting input terminal with the reference voltage VREF at the non-inverting input terminal to control the voltage VOSC output from the output terminal OUT3 to drop if the peak hold voltage PH is higher than the reference voltage VREF and to rise if the peak hold voltage PH is lower than the reference voltage VREF.

Meanwhile, the oscillation signal OSCOUT of the oscillation circuit 1 increases/decreases in amplitude along with an increase/decrease in the drive voltage VOSC input to the power supply terminal VR.

Thus, the regulator 3 controls the drive voltage VOSC of the oscillation circuit 1 to output the oscillation signal OSCOUT with a peak value amplitude of equal to that of the reference voltage VREF.

Figure 5:
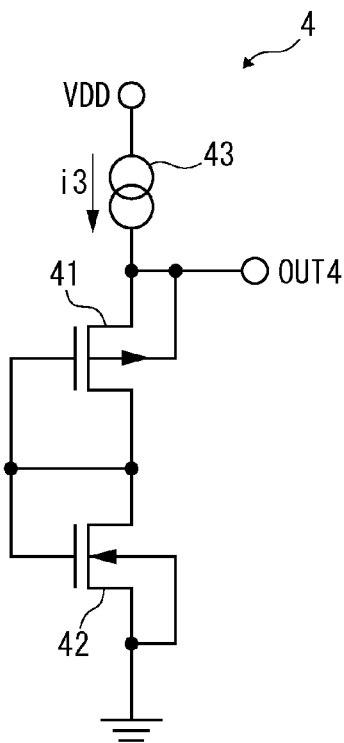
FIG. 5 shows an example of the inner structure of a constant voltage generator according to the first embodiment.

FIG. 5 shows an example of the inner structure of the constant voltage generator 4 in FIG. 1. The constant voltage generator 4 is configured to generate the reference voltage VREF to determine the peak voltage of amplitude of the oscillation signal OSCOUT of the oscillation circuit 1. It can be arbitrarily formed as long as it can generate a constant voltage.

For example, it can be a resistance voltage divider generating a desired power supply voltage VDD, a typical band gap reference circuit, or a battery.

FIG. 5 shows an example of the constant voltage generator 4 using a CMOS transistor. Therein, a source of the NMOS transistor 42 is connected to GND and a drain and a gate thereof are connected, and the drain is also connected to gate and drain of the PMOS transistor 41, to supply current i3 to the source of the PMOS transistor 41 from the constant current source 43. The back gates of the PMOS transistor 41 and the NMOS transistor are connected with their own sources.

The constant voltage generator 4 adjusts the current i3 from the constant current source 43 to a proper value to output a voltage at a sum of the thresholds Vth of the PMOS transistor 41 and the NMOS transistor 42 from the output terminal OUT4.

In terms of direct current, the oscillation circuit 1 in FIG. 2 can omit the crystal oscillator 13 and capacitors 14, 15 and at the resistance 16 being 0Ω, it becomes equivalent to the constant voltage generator 4 in FIG. 5. That is, without supply of the drive voltage being over the sum of the thresholds Vth of the PMOS transistor 11 and the NMOS transistor 12 to the power supply terminal VR, the current i3 does not flow so that the oscillation circuit cannot operate. The drive voltage VOSC needs to be the sum of the thresholds Vth of the PMOS transistor 11 and the NMOS transistor 12 at minimum.

In other words, the peak voltage of the amplitude of the oscillation signal OSCOUT is controlled to be the minimal operation voltage of the oscillation circuit 1 constantly.

Moreover, the amplitude of the oscillation signal is suppressed not to be extraneously large and the minimal operation voltage of the oscillation circuit 1 is ensured.

Further, the suppression of the amplitude of the oscillation signal OSCOUT results in reducing the current consumption of the oscillation circuit 1 and the power consumption of the oscillator.

By closely disposing the PMOS transistors 11, 41 and NMOS transistors 12, 42 in a similar form on an actual IC board, it is able to properly prevent not only a fluctuation in the threshold Vth of the MOS transistors due to a difference in manufacture process but ambient factors such as temperature, package stress, a temporal change in the property of an element as a transistor.

Figure 6:
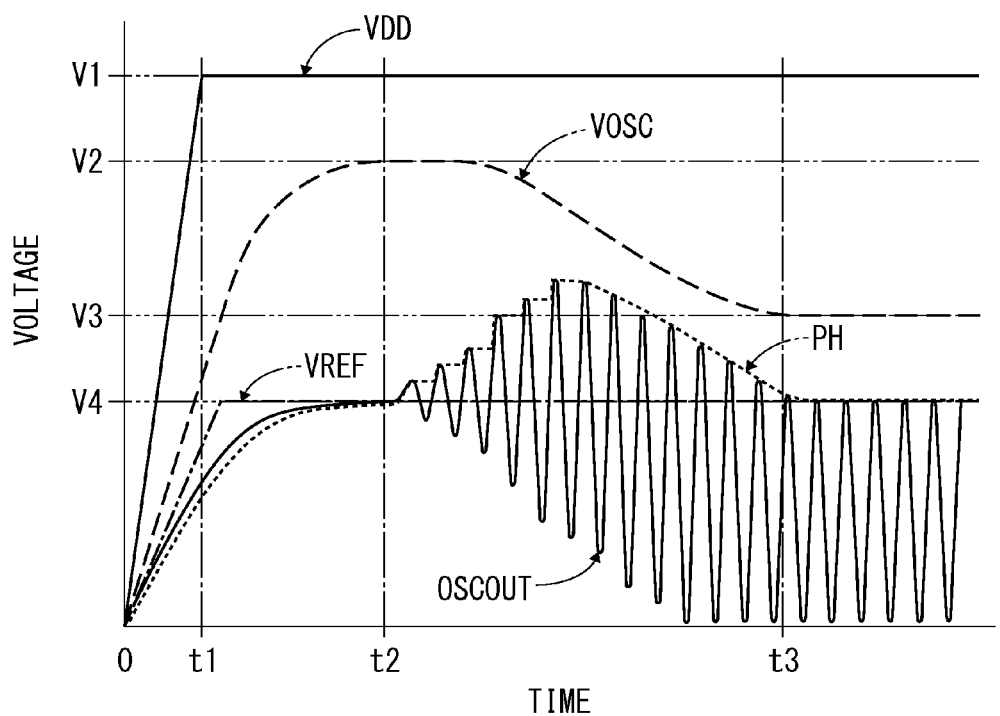
FIG. 6 is a voltage waveform graph showing the operation of the oscillator according to the first embodiment.

The operation of the oscillator is now described with reference to FIG. 6. FIG. 6 shows the operation waveforms of the oscillator according to the present embodiment. Note that in the drawing the oscillation cycle of the oscillation signal OSCOUT is intentionally drawn with exaggeration for better understanding of the relationship with the peak hold voltage PH.

At power-on at time zero, the power supply voltage gradually rises from 0V and reaches V1 at time t1. The reference voltage VREF reaches a predetermined voltage V4 and becomes stable, slightly delaying from the power supply voltage VDD owing to an operational delay of the circuit.

The drive voltage VOSC of the oscillation circuit 1 rises together with the rising of the power supply voltage VDD. In this period the oscillation circuit 1 has not started oscillating so that the input and output of the inverter thereof have the same voltage. The oscillation signal OSCOUT output from the oscillation circuit 1 has a voltage as about a half of the drive voltage VOSC from the regulator 3, as described above. Also, the peak hold voltage PH is almost the same as the voltage of the oscillation signal OSCOUT.

The regulator 3 as an operational amplifier controls the drive voltage VOSC so that the peak hold voltage PH and the reference voltage VREF coincide with each other, and they become coincident at time t2. At the same potential of the peak hold voltage PH as inverting input (−) and the reference voltage VREF as non-inverting input (+), the regulator 3 is virtually grounded.

At time t2 the oscillation signal OSCOUT has not oscillated yet so that the voltage of the oscillation signal OSCOUT is about a half of the drive voltage VOSC and so is the peak hold voltage PH. The regulator 3 controls the drive voltage VOSC to be about twice the reference voltage VREF since the peak hold voltage PH and the reference voltage VREF are virtually grounded.

It takes the time t2 for the peak hold voltage PH to almost coincide with the reference voltage VREF because of a delay due to the crystal and capacitors in the oscillation circuit 1.

When gradually rising from 0V, the drive voltage VOSC at which the oscillation circuit 1 starts oscillating is referred to as oscillation start voltage.

One important point is to set the reference voltage VREF so that the drive voltage output from the regulator 3 is the oscillation start voltage or more while the circuit 1 is not in oscillation and the reference voltage VREF and the peak hold voltage PH are virtually grounded. Thereby, the oscillator 5 according to the present embodiment can start oscillating after power-on without fail.

Immediately after the time t2, the oscillation signal OSCOUT starts oscillating and gradually increases in the oscillation amplitude. The peak hold voltage PH while holding the peak value of the oscillation signal OSCOUT gradually rises.

The increase in the peak hold voltage PH disrupts the virtual ground of the reference voltage VREF and the peak hold voltage PH. The regulator 3 decreases the drive voltage VOSC of the oscillation circuit 1 to restore the virtual ground.

At time t3 the reference voltage VREF and the peak hold voltage PH become virtually grounded again and the oscillation amplitude becomes constant. Because of this, the peak value of the oscillation signal OSCOUT is controlled to be stable at the voltage V4 as the reference voltage VREF. Also, the drive voltage VOSC of the oscillation circuit 1 becomes stable at the voltage V3.

While the drive voltage VOSC is dropping, the oscillation circuit 1 stops oscillating at a certain voltage. The minimal drive voltage VOSC, immediately before the oscillation stoppage, which can sustain the oscillation is referred to as oscillation sustainable voltage.

Another important point in designing the oscillator 5 is that the reference voltage VREF is set to about the oscillation sustainable voltage. Thereby, the peak value of the amplitude of the oscillation signal OSCOUT can always coincide with the oscillation sustainable voltage since the peak hold voltage PH of the oscillation signal OSCOUT is controlled by the reference voltage VREF.

Further, the regulator 3 controls the drive voltage VOSC to be slightly higher than the oscillation sustainable voltage so that the current consumption can be reduced to as a small amount as possible. Thereby, sufficient oscillation amplitude and low current consumption can be concurrently achieved advantageously.

At the reference voltage VREF being greatly higher than the oscillation sustainable voltage, the oscillation amplitude will be much more stable than the oscillation sustainable voltage. However, the drive voltage VOSC will be greatly higher than the oscillation sustainable voltage, which causes extraneous current consumption and a decrease in the backup time.

Oppositely, at the reference voltage VREF being greatly lower than the oscillation sustainable voltage, the drive voltage VOSC will be almost the same as the oscillation sustainable voltage, reducing the current consumption to a minimum and elongating the backup time. However, the oscillation signal OSCOUT is placed into an unstable state to stop the oscillation, which may degrade the reliability of timer function. Thus, it is necessary to set the drive voltage VOSC to be not equal to but slightly higher than the oscillation sustainable voltage. Accordingly, it is important to set the reference voltage VREF to around the oscillation sustainable voltage.

In stationary oscillation after the time t3, the peak value of the amplitude of the oscillation signal OSCOUT is surely maintained at the oscillation sustainable voltage in good oscillation state while the drive voltage VOSC is controlled to the minimal voltage sufficient to maintain the oscillation. Thus, the power consumption of the oscillation circuit 1 can be reduced to a minimum.

By setting the reference voltage VREF to satisfy the above two important points, it is made possible to realize the oscillator which can surely start oscillating and minimally consumes power in the stationary oscillation.

Second Embodiment

In the second embodiment an oscillator including a bottom hold circuit in replace of the peak hold circuit is described with reference to FIG. 7A. The oscillator in the second embodiment can attain the same effects as those in the first embodiment. The reference voltage VREF is set to around a GND voltage (0V).

Figure 7A:
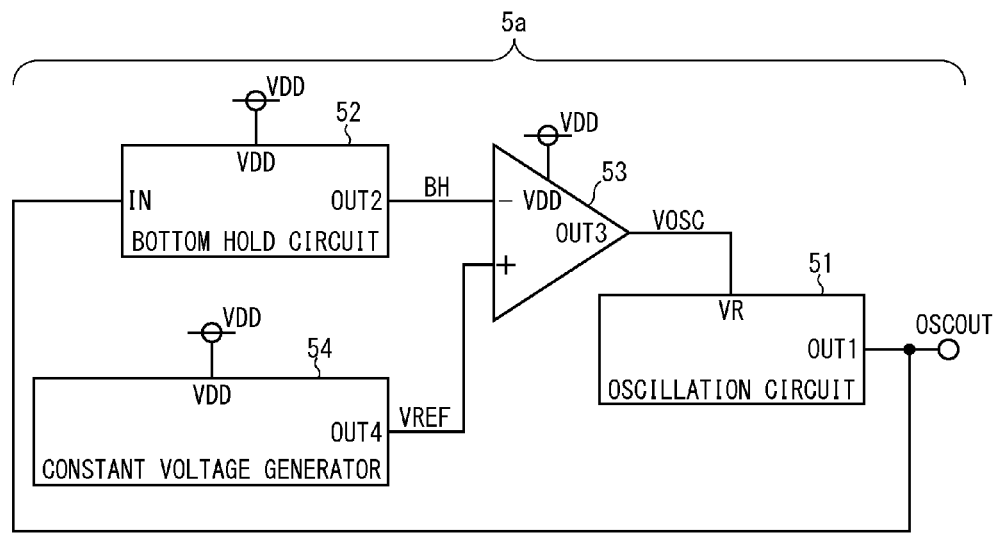
FIG. 7A shows an example of an oscillator according to a second embodiment including a bottom hold circuit instead of the peak hold circuit in FIG. 1.

An oscillator 5a in FIG. 7A includes an oscillation circuit 51, a bottom hold circuit 52, a regulator 53 and a constant voltage generator 54.

The bottom hold circuit 52 holds a bottom value of the oscillation signal OSCOUT from the oscillation circuit 51 as a bottom hold voltage BH and outputs the voltage BH to a positive input of the regulator 53 and the reference voltage VREF to a negative input thereof. The regulator 53 controls the drive voltage VOSC of the oscillation circuit 51 so that the bottom hold voltage BH coincides with the reference voltage VREF.

The oscillation circuit 1 uses a crystal oscillator element or the like to output the oscillation signal OSCOUT from an output terminal OUT1. The oscillation signal OSCOUT is output to the input terminal IN of the peak hold circuit 52 from the oscillator 5a for use in a clock system.

The bottom hold circuit 52 holds a minimal or bottom value of the amplitude of the oscillation signal OSCOUT for a certain period of time and outputs it as the bottom hold voltage BH from an output terminal OUT2.

The constant voltage generator 54 generates a constant voltage, and outputs it from an output terminal OUT4 to the regulator 3 as the reference voltage VREF.

The bottom hold voltage BH and the reference voltage VREF are input to a non-inverting input terminal (+) and an inverting input terminal (−) of the regulator 53 while the voltage VOSC output from the output terminal OUT3 of the regulator 53 is a drive voltage input to a power supply terminal VR of the oscillation circuit 51.

The operation of the oscillator 5a in FIG. 7A is almost the same as that of the oscillator 5 in FIG. 1.

Figure 7B:
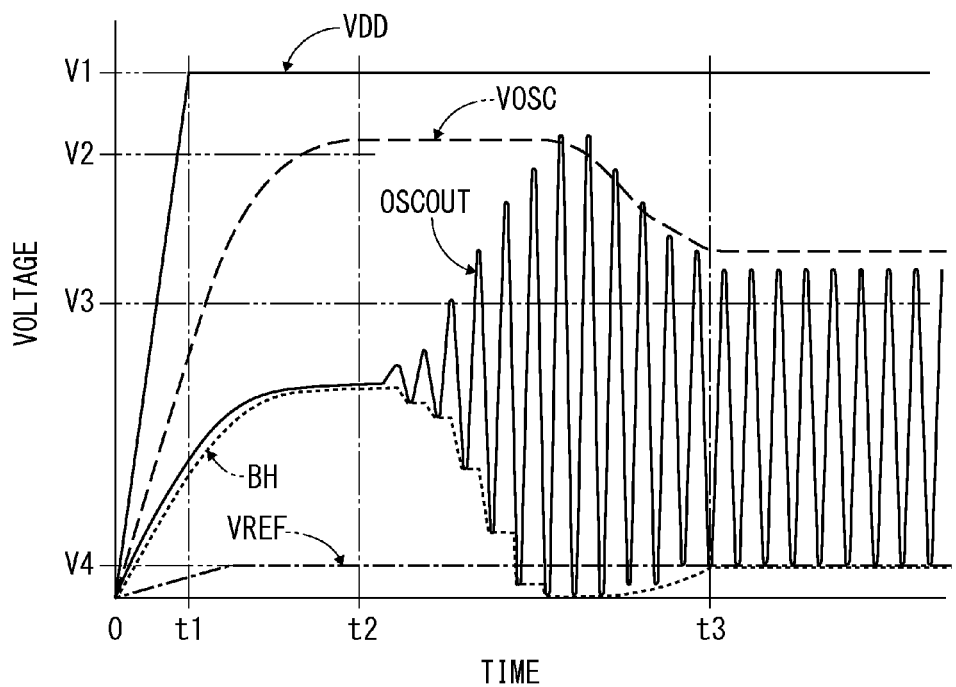
FIG. 7B is a voltage waveform graph showing the operation of the oscillator according to the second embodiment.
Figure 8A:
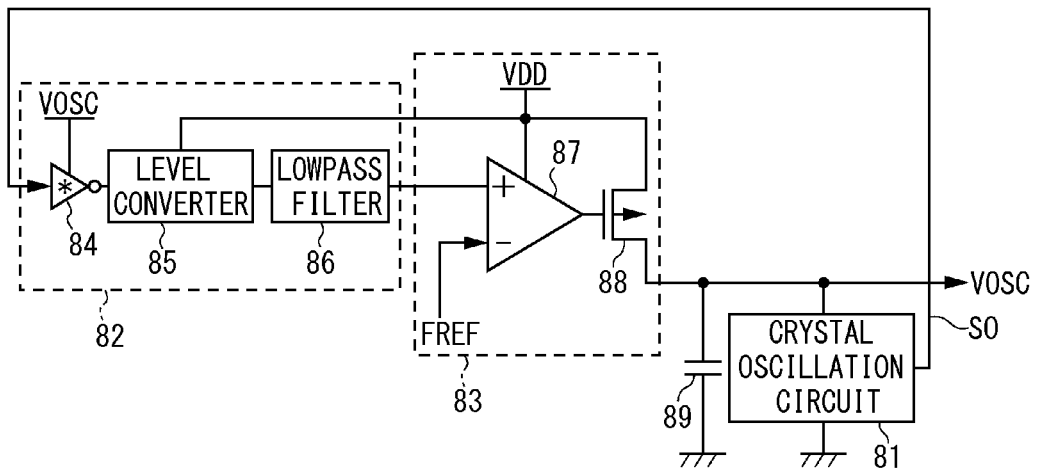
FIG. 8A schematically shows the structure of a prior art oscillator by way of example.
Figure 8B:
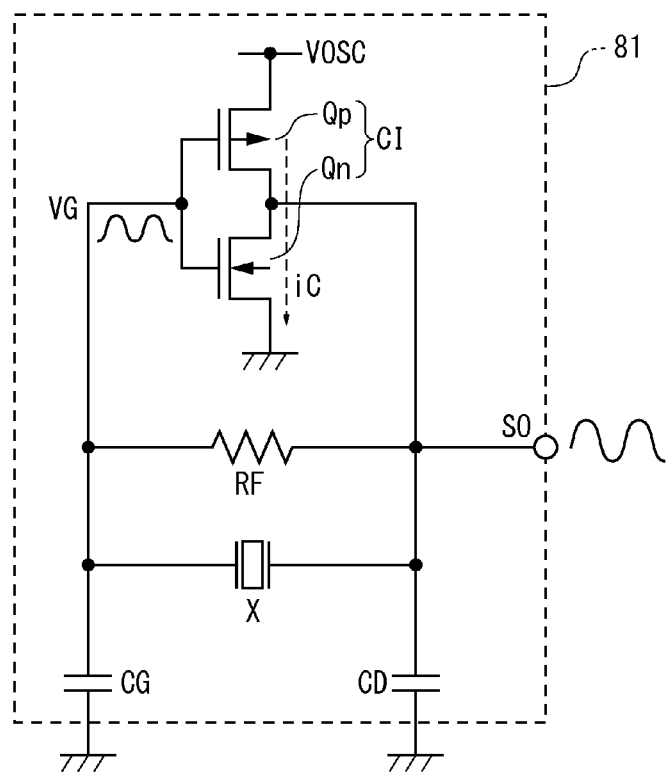
FIG. 8B schematically shows the structure of a prior art crystal oscillation circuit.
Figure 9:
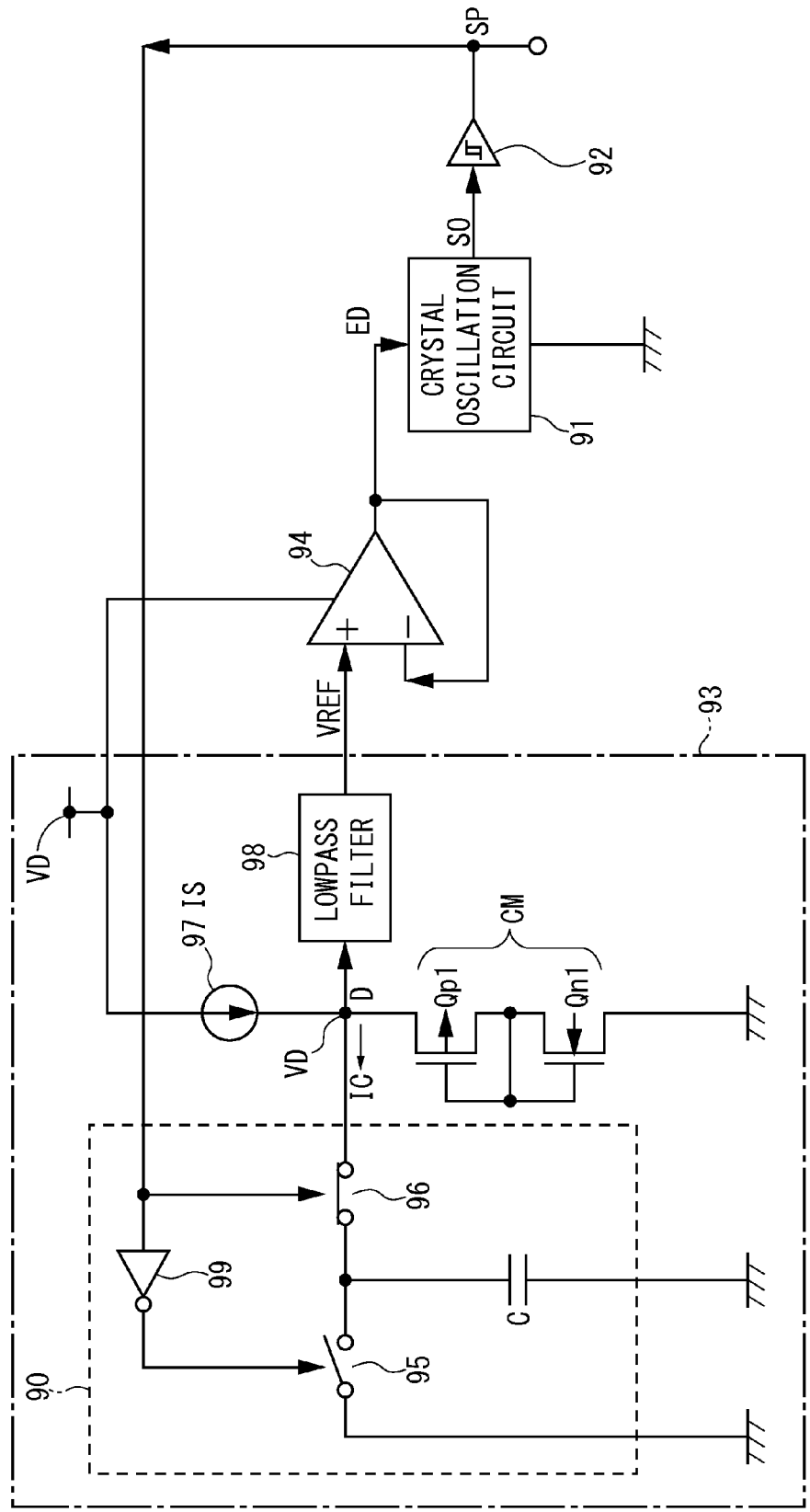
FIG. 9 schematically shows another example of the structure of a prior art oscillator.

FIG. 7B is a graph showing the waveforms of the operation of the oscillator 5a in FIG. 7A. The regulator 53 compares the bottom hold voltage BH at the inverting input terminal with the reference voltage VREF at the non-inverting input terminal to control the voltage VOSC output from the output terminal OUT3 to rise if the bottom hold voltage BH is higher than the reference voltage VREF and to drop if the bottom hold voltage BH is lower than the reference voltage VREF.

Meanwhile, the oscillation circuit 51 increases/decreases in oscillation amplitude along with an increase/decrease in the drive voltage VOSC input to the power supply terminal VR.

Thus, the regulator 53 controls the drive voltage VOSC of the oscillation circuit 51 to output the oscillation signal OSCOUT with amplitude of a bottom value equal to that of the reference voltage VREF.

The regulators 3, 53 in the first and second embodiments can be configured to output current instead of a voltage. With an appropriate capacitor provided between the drive voltage VOSC and the ground potential GND to accumulate charges, the regulators 3, 53 can stably operate.

The oscillators according to the above embodiments are applicable to a real-time clock system having a timer or calendar function, various clock generators such as one for a microprocessor or a reference clock generator for a communication device, and a semiconductor device and an electronic device incorporating such a clock generator.

In the first and second embodiments the peak or bottom hold circuit is configured to directly output the peak or bottom voltage of the amplitude of the oscillation signal. This eliminates the necessity for a lowpass filter provided in the prior art to smooth the voltage.

In general a lowpass filter is made up of an RC integrated circuit having a resistance and a capacitor, and the lower the frequency, the larger the time constant so that it requires a larger resistance value or a larger capacitance value.

To acquire a larger resistance or capacitance value on a semiconductor circuit board, a larger size is needed, which may increase manufacture costs and reduces production efficiency. This will be a conspicuous problem for electronic devices, especially for the oscillator intended for a timer using a low frequency of 32 kHz.

Thus, it is advantageous over the prior art that the oscillator according to the above embodiments does not need a lowpass filter and a large size when mounted on a semiconductor device.

The oscillator in the first and second embodiments uses the peak or bottom hold circuit which operates by constant current without transient power consumption and detects the amplitude of an oscillation signal to feed it back to the regulator without the occurrence of a rectangular wave with large amplitude causing noise Accordingly, it can reduce erroneous power consumption and reduce the occurrence of noise and prevent deterioration in the oscillation property.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. An oscillator comprising:
   a reference voltage generator;
   an oscillation element configured to oscillate by either a drive voltage or drive current and output an oscillation signal;
   a peak hold element configured to detect a peak level of the oscillation signal for output; and
   a regulator configured to increase or decrease the drive voltage or drive current in accordance with the reference voltage generated by the reference voltage generator and the peak level output from the peak hold element, wherein
   the reference voltage generator comprises a fourth PMOS transistor and a third NMOS transistor to output a voltage of a sum of a threshold of the fourth PMOS transistor and a threshold of the third NMOS transistor as the reference voltage.

2. An oscillator according to claim 1, wherein:
   the reference voltage generator comprises a third constant current source, the fourth PMOS transistor, and the third NMOS transistor connected in series;
   a source of the third NMOS transistor is grounded, a drain and a gate of the third NMOS transistor are connected with each other, the drain of the third NMOS transistor is connected with a gate and a drain of the fourth PMOS transistor; and
   a source of the fourth PMOS transistor is supplied with current from the third constant current source to output, as the reference voltage, a voltage of the sum of the threshold of the fourth PMOS transistor and the threshold of the third NMOS transistor.

3. A clock generator comprising the oscillator according to claim 1.

4. A semiconductor device comprising the clock generator according to claim 3.

5. An electronic device comprising the semiconductor device according to claim 4.

* * * * *